(12) United States Patent
McClure

(10) Patent No.: US 6,990,011 B2
(45) Date of Patent: Jan. 24, 2006

(54) MEMORY CIRCUIT AND METHOD FOR CORRUPTING STORED DATA

(75) Inventor: David C. McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/695,239

(22) Filed: Oct. 27, 2003

(65) Prior Publication Data

US 2004/0223359 A1 Nov. 11, 2004

Related U.S. Application Data

(60) Provisional application No. 60/469,282, filed on May 9, 2003.

(51) Int. Cl.
*G11C 7/00* (2006.01)
(52) U.S. Cl. ...................................... 365/154; 365/156
(58) Field of Classification Search ................ 365/154, 365/156, 189.11
See application file for complete search history.

(56) References Cited

U.S. PATENT DOCUMENTS

| | | | | |
|---|---|---|---|---|
| 5,303,190 A | * | 4/1994 | Pelley, III | 365/189.11 |
| 5,668,770 A | * | 9/1997 | Itoh et al. | 365/227 |
| 5,724,648 A | * | 3/1998 | Shaughnessy et al. | 455/519 |
| 5,781,482 A | * | 7/1998 | Sakata | 365/189.11 |

* cited by examiner

*Primary Examiner*—Vu A. Le
(74) *Attorney, Agent, or Firm*—Lisa K. Jorgenson; Andre M. Szuwalski

(57) ABSTRACT

A method and circuit are disclosed for an integrated circuit having one or more memory cells, each memory cell including first and second p-channel transistor and first and second n-channel transistors configured as cross-coupled logic inverters between first and second reference voltage levels during a normal mode of operation. Power control circuitry is coupled to a source terminal of the first p-channel transistor of each memory cell for providing to the first p-channel transistors the first reference voltage level during the normal mode of operation. This causes a first voltage less than the first reference voltage level to appear at the source terminal of the first p-channel transistors during a data corruption mode of operation wherein data stored in the one or more memory cells is corrupted.

32 Claims, 3 Drawing Sheets

US 6,990,011 B2

MEMORY CIRCUIT AND METHOD FOR CORRUPTING STORED DATA

PRIORITY CLAIM

The present application claims priority from co-pending U.S. Provisional Application for patent Ser. No. 60/469,282, filed May 9, 2003, the disclosure of which is hereby incorporated by reference

BACKGROUND OF THE INVENTION

Technical Field of the Invention

The present invention relates to a volatile memory, and particularly to a memory having circuitry for corrupting the stored data values in a relatively low power operation.

SUMMARY OF THE INVENTION

Exemplary embodiments of the present invention overcome shortcomings in prior memories and/or systems having memory, and satisfy a significant need for memory in which data stored in a memory device may be corrupted quickly, simply and with relatively low power.

According to an exemplary embodiment of the present invention, a memory device may include a plurality of memory cells, each memory cell capable of storing one or more data values therein and being coupled to first and second power supply nodes and/or lines. Power control circuitry may be coupled to the one or more memory cells for placing a first voltage reference on the first power supply node and a second voltage reference on the second power supply node during a normal mode of operation. The power control circuitry may also cause a first voltage less than the first voltage reference to appear on the first power supply node during a data corruption mode of operation wherein the one or more data values stored in each of the one or more memory cells are corrupted. By causing the first power supply node to transition in this manner during the data corruption mode, current dissipated by the memory cells during the data corruption mode is related mostly to discharging the charge appearing on the first power supply node. Consequently, current dissipation is reduced.

According to another exemplary embodiment of the present invention, the power control circuitry may also cause a second voltage greater than the second voltage reference to appear on the second power supply node during the data corruption mode of operation.

Further, the first and second power supply nodes may be shorted together during at least a portion of the data corruption mode of operation, prior to the first power supply node being at the first voltage and the second power supply node being at the second voltage. This allows for use of the charge appearing on the first power supply node to charge the second power supply node. Consequently, there is less power dissipated during the data corruption mode.

An exemplary embodiment of the invention is directed to control/timing circuitry for controlling the power supply nodes in a block of memory cells so that the data values stored in the memory cells in the block may be corrupted substantially simultaneously or, alternatively, in a more sequential manner. With regard to the latter, the control/timing circuitry includes a counter with each state of the counter corresponding to a distinct power supply node being controlled.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
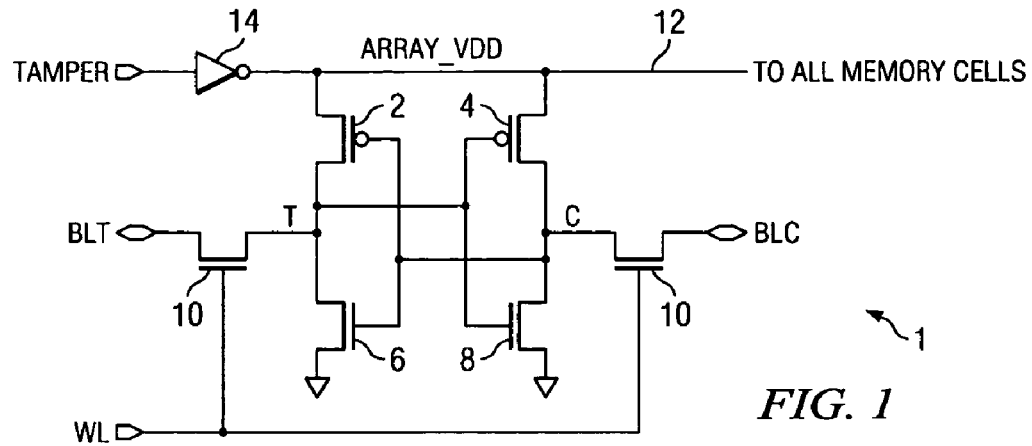
FIG. 1 is a diagram of a memory cell according to an exemplary embodiment of the present invention.

Referring to FIG. 1, there is shown a memory cell 1 that is capable of having its stored data value corrupted. Memory cell 1 may include p-channel transistors 2 and 4, and n-channel transistors 6 and 8. Transistors 2–8 may be coupled together as shown in FIG. 1 so as to form a pair of cross-coupled logic inverters when memory cell 1 is configured in a normal mode of operation. Memory cell 1 may also include a pair of pass gate transistors 10 for providing data to and from memory cell 1.

Each of n-channel transistors 6 and 8 may have a source terminal coupled to the low voltage reference Vss. Each of the p-channel transistors 2 and 4 may have a source terminal coupled to a power supply line 12.

During a normal mode of operation, power supply line 12 is at a high voltage reference Vdd. However, during a data corruption mode of operation, power supply line 12 is pulsed to a voltage less than the high voltage reference Vdd, such as the low voltage reference Vss. The pulsing of the voltage appearing on power supply line 12 is of a magnitude and duration to cause the data value stored in memory cell 1 to be corrupted. By pulsing power supply line 12 during the data corruption mode of operation instead of pulsing the low voltage reference Vss upwardly, the current dissipated during the data corruption mode of operation is primarily due to the charge built up on power supply line 12 being dissipated. There is substantially no crow-bar current when data is corrupted in this manner. As a result, current dissipation is reduced, and substantially simultaneously corrupting data in a relatively large number of memory cells 1 may therefore be efficiently performed.

FIG. 1 also shows a driver circuit 14 for driving power supply line 12 to the high voltage reference during a normal mode of operation, and to a lower voltage during a data corruption mode of operation. Driver circuit 14 may drive power supply line 12 to the desired voltage level in response to the occurrence of a triggering event, such as the detection of a switch (not shown) switching between open and closed states. Though driver circuit 14 is depicted as a logic inverter, it is understood that driver circuit may be implemented in other ways.

For instance, driver circuit 14 may instead be a transistor coupled between power supply line 12 and the high voltage reference source. During the normal mode of operation, the transistor is activated and power supply line 12 is coupled to the high voltage reference. During the data corruption mode of operation, however, the transistor may be deactivated so that power supply line 12 is undriven and the charge thereon allowed to dissipate.

Figure 2:
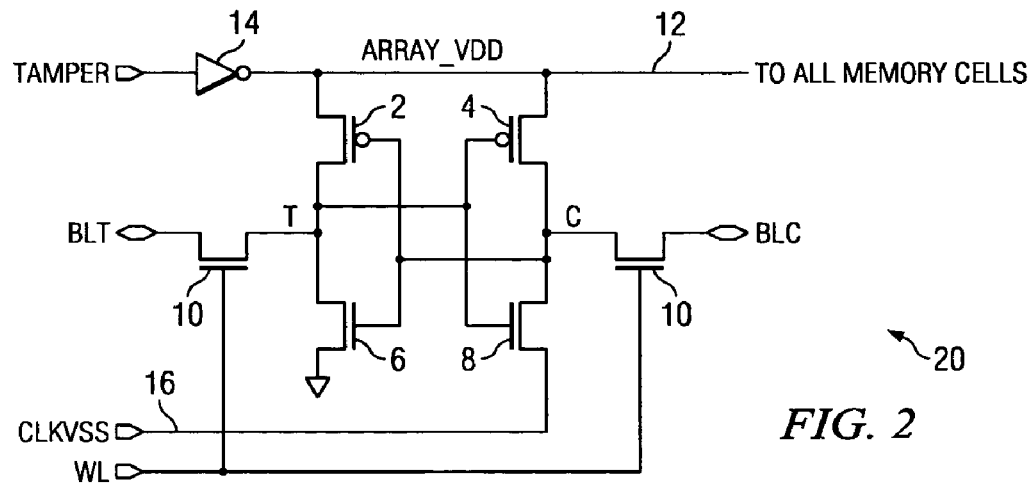
FIG. 2 is a diagram of another memory cell according to another exemplary embodiment of the present invention.
Figure 3:
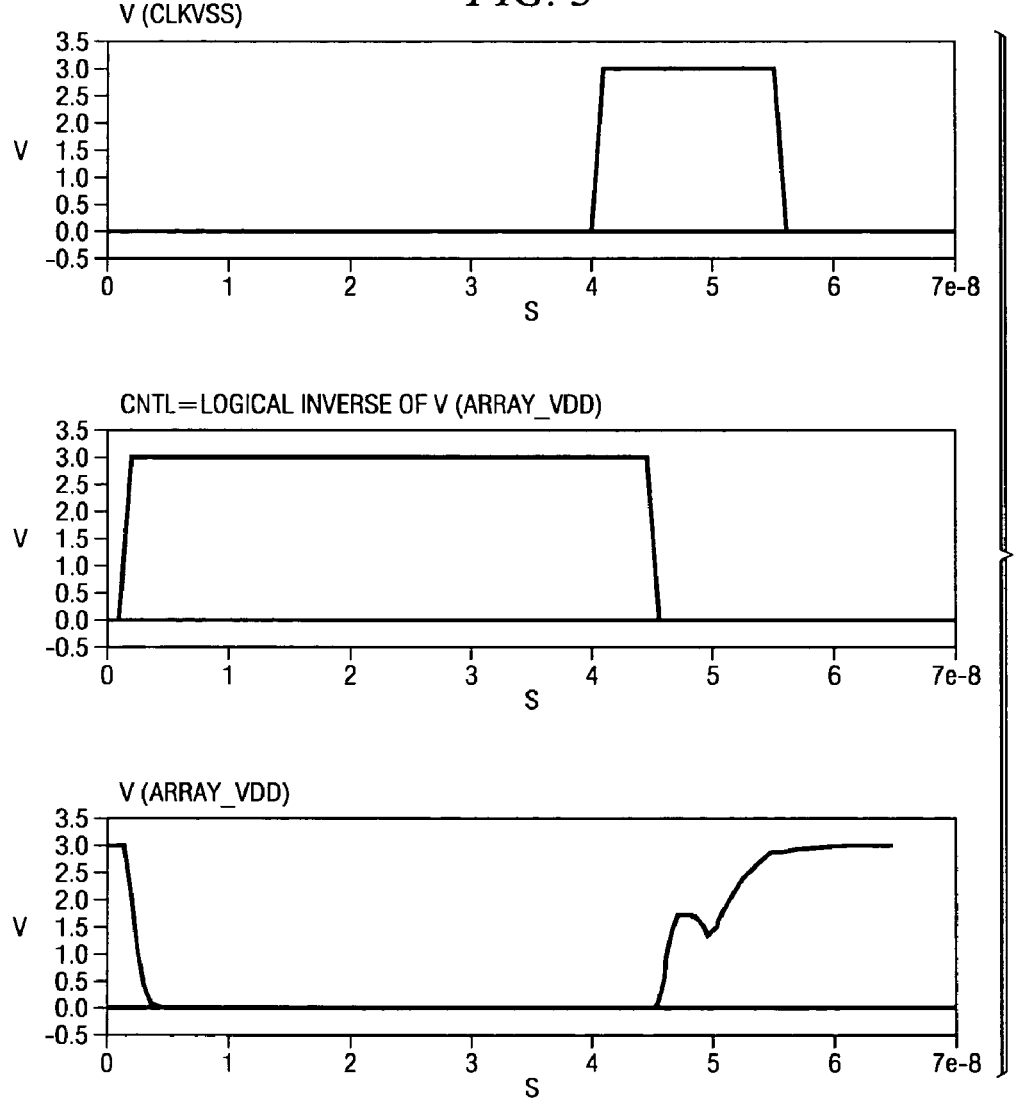
FIG. 3 is a timing diagram illustrating a data corruption operation of the memory cell of FIG. 2.

FIG. 2 illustrates a memory cell 20 according to another exemplary embodiment of the invention. Unlike memory cell 1 of FIG. 1, memory cell 20 includes a connection to a second power supply line 16. The source terminal of one of the n-channel transistors, in this case n-channel transistor 8, is coupled to second power supply line 16. Memory cell 20 may have its stored data value corrupted by causing power supply line 12 to pulse to a lower voltage level, such as the low voltage reference Vss, followed by pulsing second power supply line 16 to a higher voltage level, such as high voltage reference Vdd. FIG. 3 illustrates the timing involved in pulsing power supply line 12 and second power supply line 16.

Normally, as shown in FIG. 3, power supply line 12 is pulsed low, then second power supply line 16 is pulsed high, followed by power supply line 12 returning to the high voltage reference Vdd. However, in the event it is required that an integrated circuit having many memory cells 20 have very low current dissipation, such as may occur if the integrated circuit is being powered by a back-up battery, only power supply line 12 may be pulsed low while the integrated circuit remains in the low current mode. After the integrated circuit returns to a higher current mode, the remaining activity on power supply line 12 and second power supply line 16 may occur. In this way, there is substantially little current dissipated while the integrated circuit is in the low current mode.

Power supply line 12 may be driven by a driver circuit 14 as shown in FIG. 1. Alternatively, a transistor may be coupled between power supply line 12 and the high voltage reference Vdd, activated to couple power supply line 12 to high voltage reference Vdd during the normal mode of operation, and deactivated to allow the charge on power supply line 12 to discharge during the data corruption mode of operation.

Figure 4:
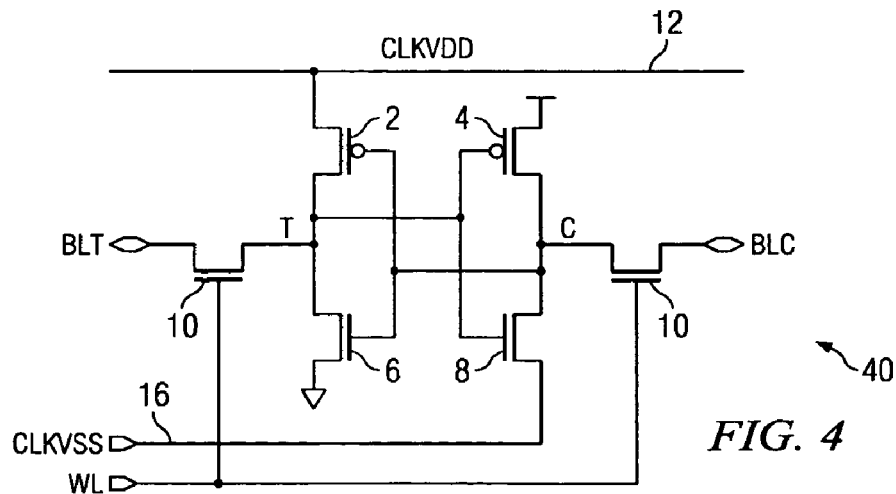
FIG. 4 is a diagram of a memory cell according to another exemplary embodiment of the present invention.

FIG. 4 illustrates a memory cell 40 according to another exemplary embodiment of the invention. Memory cell 40 is similar to memory cell 20 of FIG. 2, with one exception. In memory cell 40, only one p-channel transistor is coupled to power supply line 12. Specifically, the source of p-channel transistor 4 is coupled to the high voltage reference Vdd and thus is not pulsed to a lower voltage level as explained above. The timing of the pulses applied to power supply line 12 and second power supply line 16 may be as shown in FIG. 3. Similar to memory cell 20, power supply line 12 of FIG. 4 may be driven by a driver circuit 14 or coupled to the high voltage reference Vdd through a transistor. In the latter scenario, a sufficient amount of time may be allotted to allow the charge appearing on power supply line 12 to sufficiently dissipate prior to pulsing the voltage on second power supply line 16 to a higher voltage than normal.

Figure 5:
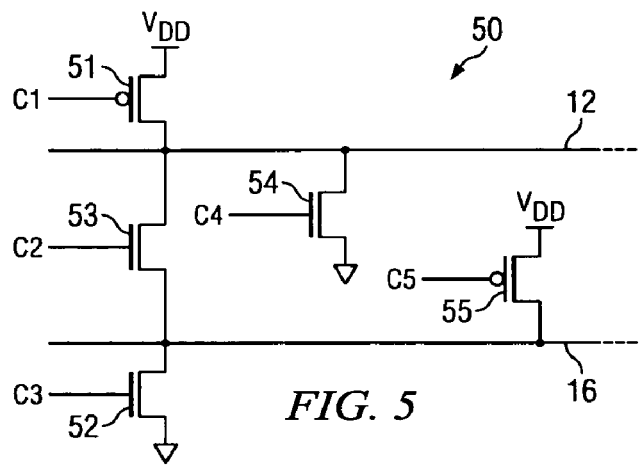
FIG. 5 is a control circuit according to an exemplary embodiment of the present invention.

FIG. 5 illustrates control circuitry 50 for controlling power supply line 12 and second power supply line 16, according to another exemplary embodiment of the present invention. During the data corruption mode of operation, control circuitry 50 allows for the charge appearing on power supply line 12 to be used in building the charge on second power supply line 16. Control circuitry 50 may include transistor 51 coupled between power supply line 12 and the high voltage reference Vdd; transistor 52 coupled between second power supply line 16 and the low voltage reference Vss; transistor 53 coupled between power supply line 12 and second power supply line 16; transistor 54 coupled between power supply line 12 and the low voltage reference Vss; and transistor 55 coupled between the high voltage reference and second power supply line 16. Transistors 51 and 52 are activated and transistors 53–55 are deactivated during the normal mode of operation.

With reference to FIG. 5, there will be described the execution of a data corruption operation using control circuitry 50. During the data corruption mode of operation, transistors 51 and 52 are initially deactivated. With power supply line 12 and second power supply line 16 floating, transistor 53 is activated to short power supply line 12 and second power supply line 16. At this point, the charge appearing on power supply line 12 is shared with second power supply line 16. After transistor 53 is turned off, transistors 54 and 55 may be activated. Alternatively, transistors 51 and 55 may be activated, though this may result in an increased amount of current draw. Next, transistor 51 may be activated to couple power supply line 12 to the high voltage reference Vdd, followed by transistor 52 being activated to couple second power supply line 16 to the low voltage reference Vss.

Figure 6:
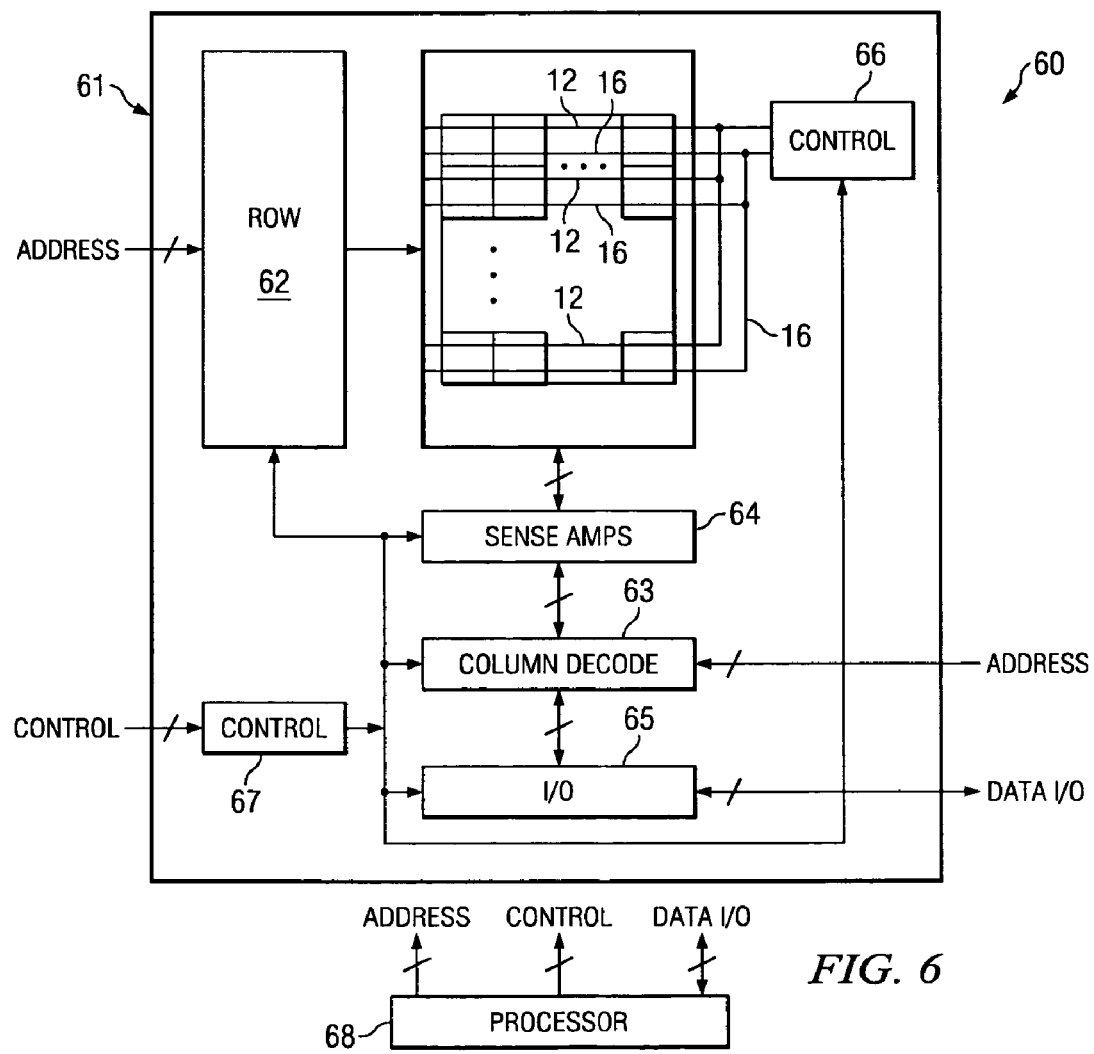
FIG. 6 is a block diagram of a system having a memory device with data corruption circuitry according to an exemplary embodiment of the present invention.

FIG. 6 illustrates a system 60 in which a volatile memory device 61 may be disposed. Memory device 61 may include an array of memory cells arranged in rows and columns. The memory cell array may include any one of memory cells 1, 20 and 40. Memory device 61 may include address decode circuitry, including a row decoder 62 which receives an external address value and selects a row of memory cells, and a column decoder 63 which receives the external address value and selects one or more columns of memory cells for connection to data input/output terminals of memory device 61. Memory device 61 may further include sense amplifiers 64 which serve to amplify signal values corresponding to data values stored in addressed memory cells, and input/output circuitry 65 for coupling addressed memory cells with the data terminals of memory device 61.

In accordance with an exemplary embodiment of the present invention, the array of memory cells may include a plurality of power supply lines 12. Though each power supply line 12 is shown in FIG. 6 as being associated with each row of memory cells, it is understood that each power supply line 12 may be associated with a column of memory cells. In the event memory cells in the memory cell array include memory cells 20 and/or 40, the memory cell array may include a plurality of power supply lines 16, each of which may be associated with a row or with a column of memory cells.

Memory device 61 may include supply line control circuitry 66 adapted to control the voltage levels provided to power supply lines 12 and 16. Supply line control circuitry 66 may, for example, include control circuitry 50 as well as timing circuitry for controlling the activation and deactivation of transistors 51–55. Alternatively, supply line control circuitry 66 may include driver circuits 14 and timing circuitry for controlling driver circuits 14. Supply line control circuitry 66 may include separate control circuits 50 or driver circuits 14 for each pair of power supply lines 12, 16. Control circuitry 67 may receive control input signals for executing a memory access operation and provide necessary timing and control circuitry to row decoder 62, column decoder 63, sense amplifiers 64 and input/output circuitry 65.

System 60 may further include a processing element 68 coupled to memory device 61 and capable of executing operations based upon data retrieved from memory device 61. Processing element 68 may further store in memory device 61 data generated by processing element 68. System 61 may be, for example, a computer-related device, a telecommunications device or some other electronics device.

What is claimed is:

1. An integrated circuit, comprising:
    one or more memory cells, each memory cell comprising first and second p-channel transistors and first and second n-channel transistors configured as cross-coupled logic inverters between first and second reference voltage levels during a normal mode of operation; and
    power control circuitry coupled to a source terminal of the first p-channel transistor and second p-channel transistor of each memory cell, for providing to the first and second p-channel transistors the first reference voltage level during the normal mode of operation, and causing a first voltage less than the first reference voltage level to appear at the source terminal of the first and second p-channel transistors during a data corruption mode of operation wherein data stored in the one or more memory cells is corrupted.

2. An integrated circuit, comprising:
    one or more memory cells, each memory cell comprising first and second p-channel transistors and first and second n-channel transistors configured as cross-coupled logic inverters between first and second reference voltage levels during a normal mode of operation; and
    power control circuitry coupled to a source terminal of the first p-channel and a source terminal of the first n-channel transistor of each memory cell, for providing to the first p-channel transistors the first reference voltage level and to the first n-channel transistors the second reference voltage during the normal mode of operation, and causing a first voltage less than the first reference voltage level to appear at the source terminal of the first p-channel transistors and a second voltage greater than the second reference voltage to appear at the source terminal of the first n-channel transistors during a data corruption mode of operation wherein data stored in the one or more memory cells is corrupted.

3. The integrated circuit of claim 2, wherein the at least one of the first and second n-channel transistors has a drain terminal coupled to a drain terminal of the second p-channel transistor.

4. The integrated circuit of claim 2, wherein, during the data corruption mode of operation, the power control circuitry pulses the source terminal of the first p-channel transistor of each memory cell to the first voltage, and pulses the source terminal of the first n-channel transistor to the second voltage, the pulses partially overlapping.

5. The integrated circuit of claim 4, wherein, during the data corruption mode of operation, a leading edge of the pulse corresponding to the first p-channel transistor occurs prior to a leading edge of the pulse corresponding to the at least one of the first and second n-channel transistors.

6. The integrated circuit of claim 5, wherein, during the data corruption mode of operation, a trailing edge of the pulse corresponding to the first p-channel transistor occurs prior to a trailing edge of the pulse corresponding to the first n-channel transistor.

7. The integrated circuit of claim 4, wherein the power control circuitry temporarily shorts the source terminal of the first p-channel transistor in each memory cell to the source terminal of the first n-channel transistor in each memory cell.

8. The integrated circuit of claim 7, wherein the power control circuitry comprises at least one first control transistor coupled between the source terminal of the first p-channel transistor of each memory cell to the source terminal of the first n-channel transistor of each memory cell.

9. The integrated circuit of claim 7, wherein the power control circuitry further comprises at least one second control transistor coupled between the first reference voltage level and the source terminal of the first transistor of each memory cell, and at least one third control transistor coupled between the second reference voltage level and the source terminal of the first n-channel transistor of each memory cell.

10. The integrated circuit of claim 1, wherein the first voltage is the second reference voltage level.

11. The integrated circuit of claim 1, wherein the first voltage is a voltage resulting from the source terminal of the first and second p-channel transistor of each memory cell being in an undriven state during the data corruption mode of operation.

12. The integrated circuit of claim 1, wherein each memory cell further comprises at least one pass gate transistor having a conduction terminal coupled to at least one bit line and a control terminal coupled to a word line, and the power control circuitry drives the bit lines to a voltage corresponding to a predetermined logic value and drives each word line to a voltage to activate each pass gate transistor during the data corruption mode of operation when the source terminal of the first and second p-channel transistor of each memory cell is at the first voltage.

13. A method of corrupting data values stored in a plurality of memory cells coupled between at least one first power supply node and at least one second power supply node, the method comprising:
    decoupling the at least one first power supply node from a first reference voltage level and causing a first voltage less than the first reference voltage level to appear on the at least one first power supply node;
    decoupling, during at least a portion of the time the at least one first power supply node is decoupled from the first reference voltage level, the at least one second power supply node from the second reference voltage level and causing a second voltage greater than the second reference voltage level to appear on the at least one second power supply node; and
    following the steps of decoupling, driving the at least one first power supply node towards the first reference voltage level.

14. The method of claim 13, further comprising driving the at least one second power supply node to a second reference voltage level during the step of driving the at least one first power supply node.

15. The method of claim 14, wherein the step of causing a second voltage comprises driving the at least one second power supply node to the second voltage.

16. The method of claim 14, wherein the second voltage is the first reference voltage level.

17. The method of claim 14, wherein the step of decoupling the at least one second power supply node occurs after the step of decoupling the at least one first power supply node.

18. The method of claim 14, further comprising shorting the at least one first power supply node to the at least one second power supply node following the steps of decoupling the at least one first power supply node and the at least one second power supply node.

19. The method of claim 14, wherein the first voltage is the second reference voltage level.

20. The method of claim 14, wherein the step of causing a first voltage comprises driving the at least one first power supply node to the first voltage.

21. A system, comprising:
a processing unit;
one or more memory cells coupled to the processing unit, each memory cell capable of storing one or more data values therein and being coupled to first and second power supply nodes; and
power control circuitry, coupled to the one or more memory cells, for placing a first reference voltage on the first power supply node and a second reference voltage on the second power supply node during a normal mode of operation, and causing a first voltage less than the first reference voltage to appear on the first power supply node and a second voltage greater than the second reference voltage to appear on the second power supply node during a data corruption mode of operation wherein the one or more data values stored in each of the one or more memory cells are corrupted.

22. The system of claim 21, wherein the first voltage is the second reference voltage.

23. A system, comprising:
a processing unit;
one or more memory cells coupled to the processing unit, wherein each memory cell comprises first and second p-channel transistors and first and second n-channel transistors configured as a logic inverter during the normal mode of operation, the first and second p-channel transistors each having a source terminal coupled to a first power supply node; and
power control circuitry, coupled to the one or more memory cells, for placing a first reference voltage on the first power supply node and a second reference voltage on the second power supply node during a normal mode of operation, and causing a first voltage less than the first reference voltage to appear on the first power supply node during a data corruption mode of operation wherein the one or more data values stored in each of the one or more memory cells are corrupted.

24. The system of claim 23, wherein the power control circuitry comprises a logic inverter having an output coupled to the first power supply node.

25. The system of claim 23, wherein the power control circuitry comprises a transistor coupled between a system power line and the first power supply node.

26. A system, comprising:
a processing unit; and
one or more memory cells coupled to the processing unit, wherein each memory cell comprises first and second p-channel transistors and first and second n-channel transistors configured as a logic inverter during the normal mode of operation, at least the first p-channel transistor having a source terminal coupled to a first power supply node, wherein a source terminal of the second n-channel transistor of each memory cell is coupled to a second power supply node, and a source terminal of the first n-channel transistor of each memory cell is coupled to a third power supply node; and
power control circuitry, coupled to the one or more memory cells, for placing a first reference voltage on the first power supply node and a second reference voltage on the second power supply node during a normal mode of operation, and causing a first voltage less than the first reference voltage to appear on the first power supply node and a second voltage greater than the second reference voltage to appear on the second power supply node during a data corruption mode of operation wherein the one or more data values stored in each of the one or more memory cells are corrupted, the third power supply node having the second reference voltage during the normal and data corruption modes of operation.

27. The system of claim 23, wherein the power control circuitry places the second reference voltage on a second power supply node coupled to a source terminal of at least one of the n-channel transistors during the normal mode of operation and causes a second voltage greater than the second reference voltage to appear on the second power supply node during the data corruption mode of operation.

28. The system of claim 27, wherein the second voltage is the first reference voltage.

29. The system of claim 27, wherein the power control circuitry comprises a first transistor coupled between the first power supply node and the second power supply node, the transistor being activated during a portion of the data corruption mode of operation and deactivated during the normal mode of operation.

30. The system of claim 29, wherein the power control circuitry comprises a second transistor coupled between the first power supply node and the second reference voltage, and a third transistor coupled between the second power supply node and the first reference voltage, the second and third transistors being activated during the data corruption mode of operation and deactivated during the normal mode of operation.

31. The system of claim 30, wherein during the data corruption mode of operation, the first transistor is activated prior to the second and third transistors being activated.

32. The system of claim 27, wherein the power control circuitry comprises a first transistor coupled between a first external voltage supply line and the first power supply node, and a second transistor coupled between a second external voltage supply line and the second power supply node, the first and second transistors being activated during the normal mode of operation and deactivated during at least a portion of the data corruption mode of operation.

* * * * *